(12) United States Patent  (10) Patent No.: US 7,936,154 B2
Lee                        (45) Date of Patent:     May 3, 2011

(54) REGULATOR AND HIGH VOLTAGE GENERATOR

(75) Inventor: Seok Joo Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 363 days.

(21) Appl. No.: 11/965,990

(22) Filed: Dec. 28, 2007

(65) Prior Publication Data

US 2009/0039840 A1   Feb. 12, 2009

(30) Foreign Application Priority Data

Aug. 8, 2007 (KR) .................. 10-2007-0079483

(51) Int. Cl.
*G05F 1/00* (2006.01)

(52) U.S. Cl. ........................................... 323/266

(58) Field of Classification Search .......... 323/265; 363/59, 60; 327/148, 157, 538, 540, 541
See application file for complete search history.

(56) References Cited

U.S. PATENT DOCUMENTS

| | | | | |
|---|---|---|---|---|
| 5,394,365 A * | 2/1995 | Tsukikawa | ............... | 365/189.09 |
| 5,418,503 A * | 5/1995 | Glazebrook | ............... | 331/167 |
| 5,822,247 A * | 10/1998 | Tassan Caser et al. | .. | 365/185.18 |
| 6,150,874 A * | 11/2000 | Fendt et al. | ............... | 327/545 |
| 6,535,435 B2 * | 3/2003 | Tanaka et al. | ............ | 365/189.09 |
| 6,597,156 B2 * | 7/2003 | Gogolla | ............... | 323/224 |
| 6,642,774 B1 * | 11/2003 | Li | ............... | 327/536 |
| 6,850,047 B2 * | 2/2005 | Itabashi et al. | ............... | 323/284 |
| 6,967,524 B2 * | 11/2005 | Saiki et al. | ............... | 327/541 |
| 7,049,880 B2 * | 5/2006 | Sivero et al. | ............... | 327/536 |
| 7,050,339 B2 * | 5/2006 | Tanzawa | ............... | 365/189.11 |
| 7,154,789 B2 * | 12/2006 | Kim et al. | ............... | 365/189.09 |
| 7,279,956 B2 * | 10/2007 | Caplan et al. | ............... | 327/536 |
| 7,282,956 B2 * | 10/2007 | Lee | ............... | 326/88 |
| 7,336,545 B2 * | 2/2008 | Tanzawa | ............... | 365/189.09 |
| 7,417,493 B2 * | 8/2008 | Lee | ............... | 327/538 |
| 7,505,290 B2 * | 3/2009 | Fujiwara | ............... | 363/60 |
| 7,564,300 B2 * | 7/2009 | Lee | ............... | 327/540 |
| 2002/0027233 A1 * | 3/2002 | Yamaki et al. | ............... | 257/200 |
| 2003/0151945 A1 * | 8/2003 | Tanzawa | ............... | 365/185.01 |
| 2005/0047181 A1 * | 3/2005 | Yamamoto et al. | ............ | 363/60 |
| 2008/0054987 A1 * | 3/2008 | Choi et al. | ............... | 327/512 |

FOREIGN PATENT DOCUMENTS

KR  10-2005-0059608 A  6/2005
KR  10-2006-0021098 A  3/2006

* cited by examiner

*Primary Examiner* — Adolf Berhane
*Assistant Examiner* — Yemane Mehari
(74) *Attorney, Agent, or Firm* — Kilpatrick Townsend & Stockton LLP

(57) ABSTRACT

A regulator included in a high voltage generator for supplying a high voltage to a semiconductor memory device is disclosed. The regulator includes a voltage dividing circuit configured to divide an output voltage of a charge pump, a comparing circuit configured to compare a reference voltage with a divided voltage by the voltage dividing circuit, a regulator driving circuit configured to couple selectively the voltage dividing circuit to a ground, and a high voltage discharging circuit configured to discharge the divided voltage applied to the comparing circuit when supply of a power supply voltage is stopped.

23 Claims, 5 Drawing Sheets

When a power supply voltage is applied $V_{DIV} = V_{REF}$ $V_{DIV} < V_{CC} + V_{th}$ When a power supply voltage is stopped $V_{DIV} = V_{PP}$ $V_{DIV} > V_{th}$

REGULATOR AND HIGH VOLTAGE GENERATOR

CROSS-REFERENCE TO RELATED APPLICATIONS

This application claims priority from Korean Patent Application No. 2007-79483, filed on Aug. 8, 2007, the contents of which are incorporated herein by reference in its entirety.

BACKGROUND OF THE INVENTION

The present invention relates to a semiconductor device lo and more specifically to a high voltage generator and a method for regulating the high voltage.

Generally, IC chips (e.g., flash memory) have circuits that require a voltage larger than a power supply voltage.

A high voltage generator for supplying a voltage larger than the power supply voltage generates the voltage by using a charge pump driven in accordance with a clock signal generated by an oscillator. Here, the high voltage generator further includes a regulator so as to maintain a constant output voltage from the charge pump. In particular, the high voltage generator compares the output voltage of the charge pump and a reference voltage, generates the clock signal through the oscillator when the output voltage of the charge pump is smaller than the reference voltage, and drives the charge pump using the clock signal. However, the high voltage generator cuts off the generation of the clock signal when the output voltage of the charge pump is higher than the reference voltage.

In certain situations, the power to the semiconductor device may be cut off unexpectedly. This would cut off to the supply of the power supply voltage and may prevent a high voltage outputted from the charge pump not to be discharged to the ground, and instead be directed to an input terminal of a comparing circuit included in the regulator. The transistor in the comparing circuit may be damaged as a result.

SUMMARY OF THE INVENTION

It is a feature of the present invention to provide a regulator having a high voltage discharging circuit for discharging a high voltage outputted from a charge pump when supply of a power supply voltage is cut off.

It is another feature of the present invention to provide a high voltage generator having the above regulator.

A regulator according to one example embodiment of the present invention includes a voltage dividing circuit configured to divide an output voltage of a charge pump; a comparing circuit configured to compare a reference voltage with a divided voltage by the voltage dividing circuit; a regulator driving circuit configured to couple selectively the voltage dividing circuit to a ground; and a high voltage discharging circuit configured to discharge the divided voltage applied to the comparing circuit when supply of a power supply voltage is stopped.

A high voltage generator according to one example embodiment of the present invention includes a regulator configured to stabilize an output voltage of a charge pump to a voltage having constant level and output the voltage. Here, the regulator has a voltage dividing circuit configured to divide an output voltage of a charge pump; a comparing circuit configured to compare a reference voltage with a divided voltage by the voltage dividing circuit, and output a control signal for controlling operation of a clock driving lo circuit; a regulator driving circuit configured to couple selectively the voltage dividing circuit to a ground; and a high voltage discharging circuit configured to discharge the divided voltage applied to the comparing circuit when supply of a power supply voltage is stopped.

A high voltage generator according to another example embodiment of the present invention includes a first regulator configured to stabilize an output voltage of a charge pump to a first regulation voltage having constant level and output the first regulation voltage; and a second regulator configured to convert the first regulation voltage into a voltage having constant level and output the voltage having constant level. Here, the first regulation has a first voltage dividing circuit configured to divide the output voltage of the charge pump, thereby outputting a first divided voltage; a first comparing circuit configured to compare a reference voltage with the first divided voltage, and output a control signal for controlling operation of a clock driving circuit; a first regulator driving circuit configured to couple selectively the first voltage dividing circuit to a ground; and a first high voltage discharging circuit configured to discharge the first divided voltage applied to the first comparing circuit when supply of a power supply voltage is stopped.

As described above, a high voltage generator of the present invention may cut off a high voltage applied to a comparing circuit in case that supply of a power supply voltage is stopped while the high voltage operates. As a result, deterioration of a transistor included in the comparing circuit and error of the high voltage generator may be prevented.

DESCRIPTION OF SPECIFIC EMBODIMENTS

Hereinafter, the embodiments of the present invention will be explained in more detail with reference to the accompanying drawings.

Figure 1:
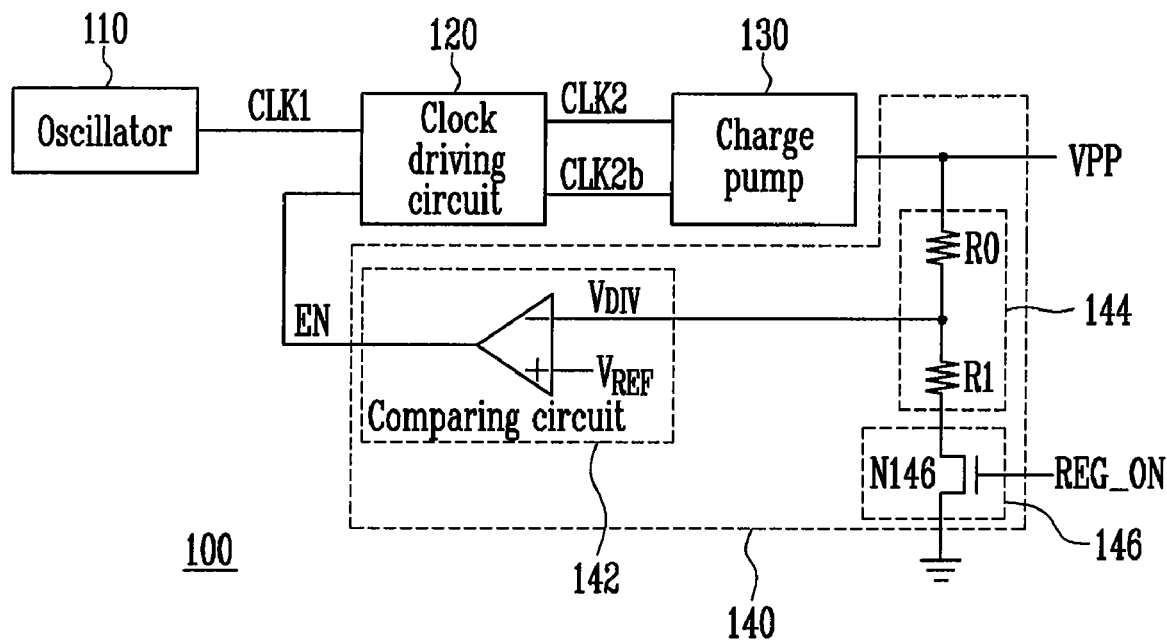
FIG. 1 is a view illustrating a circuitry of a conventional high voltage generator.

FIG. 1 is a view illustrating a circuitry of a conventional high voltage generator.

The high voltage generator 100 includes an oscillator 110, a clock driving circuit 120, a charge pump 130 and a regulator 140.

The oscillator 110 generates a clock signal CLK 1 having a specific period, and provides the generated clock signal CLK1 to the clock driving circuit 120.

The clock driving circuit 120 delays the clock signal CLK1 in accordance with an enable signal EN outputted from a comparing circuit 142 included in the regulator 140, thereby outputting two clock signals CLK2 and CLK2b, wherein the level of the clock signal CLK2 is opposite that of the clock signal CLK2b. To perform the above process, the clock driving circuit 120 includes a first inverter group (not shown) where n inverters are connected in series and a second inverter group (not shown) where (n+1) inverters are connected in series.

The charge pump 130 performs a pumping operation in accordance with the clock signals CLK2 and CLK2b outputted from the clock driving circuit 120, thereby outputting a pumping voltage VPP.

The regulator 140 stabilizes an output voltage of the charge pump 130 to a desired voltage, e.g., a voltage having a constant level.

The regulator 140 includes a voltage dividing circuit 144 for outputting a divided voltage VDIV generated by dividing the output voltage of the charge pump 130, a comparing circuit 142 for comparing the divided voltage VDIV with a reference voltage VREF and controlling operation of the clock driving circuit 120 in accordance with the compared result, and a regulator driving circuit 146 for controlling operation of the regulator 140.

The voltage dividing circuit 144 has a plurality of resistors R0 and R1 coupled in series between a terminal corresponding to the output voltage VPP of the charge pump 130 and a ground, and outputs the divided voltage VDIV to the comparing circuit 142 in accordance with a resistance ratio of the resistors R0 and R1.

The regulator driving circuit 146 includes an N-MOS transistor N146 coupled between the resistor R1 and the ground. In addition, the regulator driving circuit 146 couples the voltage dividing circuit 144 to the ground in response to a control signal REG_ON (having a high level) to a gate of the N-MOS transistor N146, thereby enabling the regulator 140.

The comparing circuit 142 compares the reference voltage VREF with the divided voltage VDIV, and outputs the signal EN having a high level to the clock driving circuit 120 when the reference voltage VREF is higher than the divided voltage VDIV.

Hereinafter, the comparing circuit 142 will be described in detail.

Figure 2:
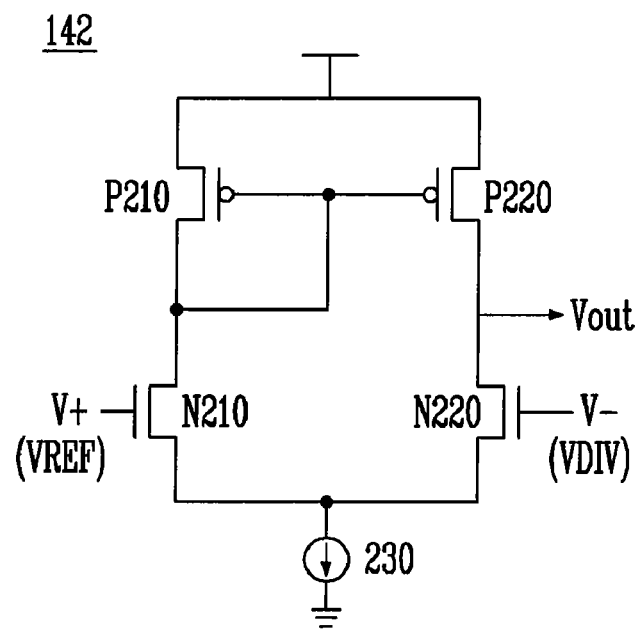
FIG. 2 is a view illustrating circuitry of the comparing circuit included in the conventional high voltage generator.

FIG. 2 is a view illustrating circuitry of the comparing circuit included in the conventional high voltage generator.

The comparing circuit 142 includes a first N-MOS transistor N210 and a second N-MOS transistor N220, wherein a first voltage (V+) is applied to a positive terminal of the first N-MOS transistor N210 and a second voltage (V−) is provided to a negative terminal of the second N-MOS transistor N220. In addition, the comparing circuit 142 further includes a constant current source 230 coupled between source terminals of the N-MOS transistors N210 and N220 and the ground. Furthermore, the comparing circuit 142 further includes a first P-MOS transistor P210 coupled between the first N-MOS transistor N210 and a power supply voltage and a second P-MOS transistor P220 coupled between the second N-MOS transistor N220 and the power supply voltage. Here, a source terminal of the first P-MOS transistor P210 is coupled to that of the second P-MOS transistor P220, and a gate terminal of the first P-MOS transistor P210 is coupled to that of the second P-MOS transistor P220. The gate terminal of the first P-MOS transistor P210 is coupled to a drain terminal of the first P-MOS transistor P210. In this case, a voltage of a node between the second N-MOS transistor N220 and the second P-MOS transistor P220 corresponds to an output voltage Vout. That is, the node in question is an output node.

In the case that the first voltage (V+) is higher than the second voltage (V−), current passing through the first N-MOS transistor N210 is increased, and current passing through the second N-MOS transistor N220 is reduced. As a result, the output voltage Vout having a high level is outputted.

In the case that the first voltage (V+) is smaller than the second voltage (V−), the current passing through the first N-MOS transistor N210 is reduced, and the current passing through the second N-MOS transistor N220 is increased. As a result, the output voltage Vout having a low level is outputted.

In brief, the first voltage (V+) and the second voltage (V−) are compared by using the comparing circuit 142 as mentioned above.

In one example embodiment of the present invention, the reference voltage VREF has the same magnitude as the divided voltage VDIV, and so a divided voltage inputted to the comparing circuit 142 may be compared with the reference voltage VREF.

A final pumping voltage VPP (i.e., output voltage of the charge pump 130) can be calculated by Equation 1 below.

$$VPP = \left(1 + \frac{R0}{R1}\right) \times VREF \quad \text{[Equation 1]}$$

Figure 3:
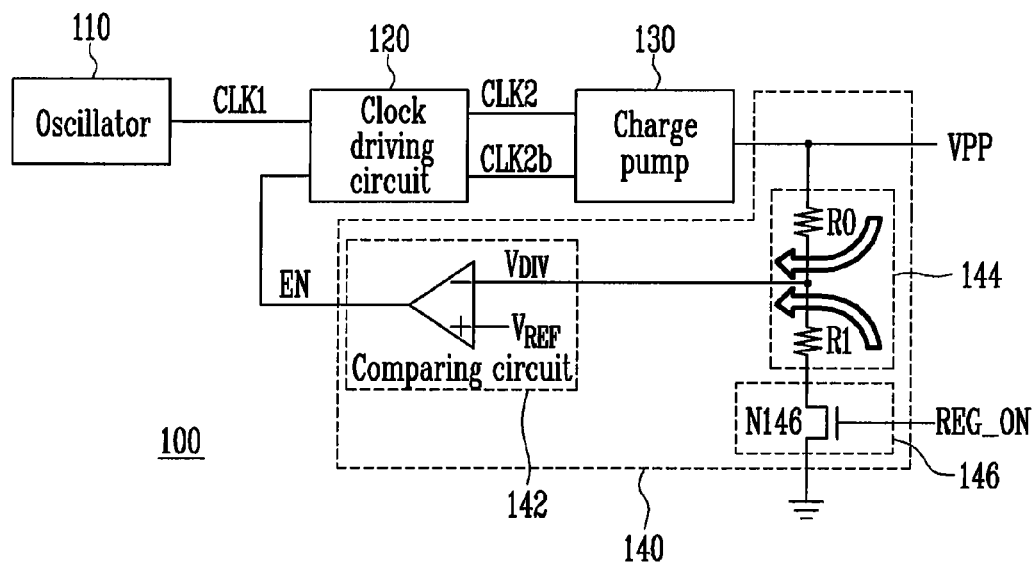
FIG. 3 is a view illustrating a problem occurred when supply of the power supply voltage is stopped in the conventional high voltage generator.

FIG. 3 is a view illustrating a problem that may result when the power supply voltage is cut off in the conventional high voltage generator.

If the power supply voltage is provided, the control signal REG_ON is changed to a low level. As a result, the N-MOS transistor N146 is turned off, and so the voltage dividing circuit 144 is disconnected from the ground. Accordingly, the high voltage outputted from the charge pump 130 cannot be discharged to the ground and is redirected to the negative terminal of the comparing circuit 142.

The voltage passed to the negative terminal of the comparing circuit 142 is applied to the gate terminal of the N-MOS transistor N220. Here, since the voltage outputted from the charge pump 130 is high (e.g., about 20V), the N-MOS transistor N220 may be damaged when the voltage is directly applied to the gate terminal of the N-MOS transistor N220. As a result, an error may occur in the high voltage generator. In some cases, the high voltage generator may be damaged because the N-MOS transistor 220 may not be able to handle such a high voltage.

Figure 4:
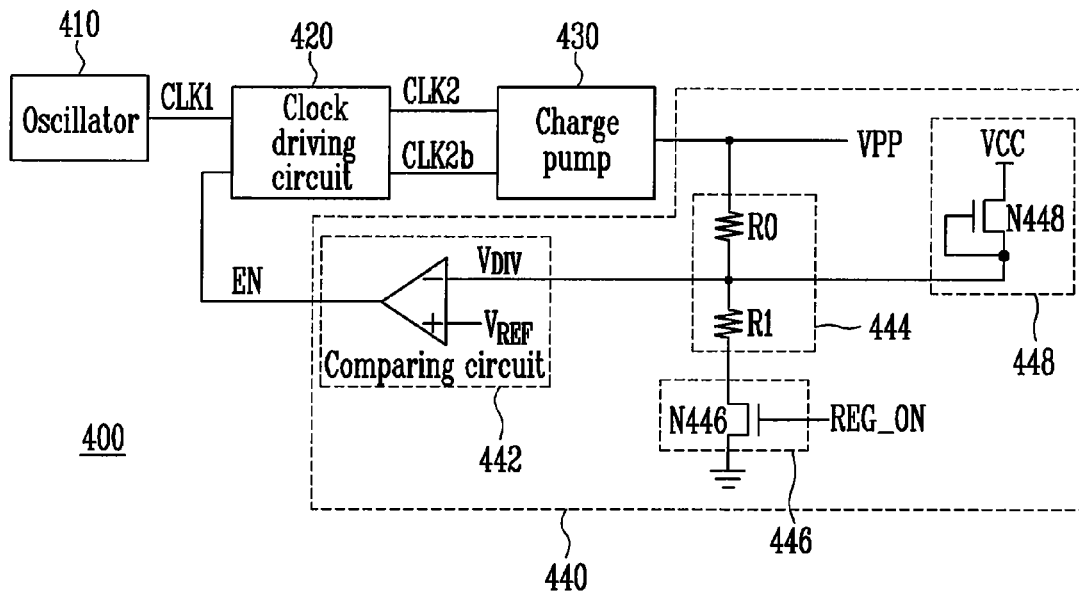
FIG. 4 is a view illustrating a circuitry of a high voltage generator according to one example embodiment of the present invention.

FIG. 4 is a view illustrating a circuitry of a high voltage generator according to one embodiment of the present invention.

The high voltage generator 400 of the present embodiment includes an oscillator 410, a clock driving circuit 420, a charge pump 430 and a regulator 440.

The oscillator 410 generates a clock signal CLK1 having a specific period, and transmits the generated clock signal CLK1 to the clock driving circuit 420.

The clock driving circuit 420 delays the clock signal CLK1 in accordance with an enable signal EN outputted from a comparing circuit 442 of the regulator 440, thereby outputting two clock signals CLK2 and CLK2b, wherein a level of the clock signal CLK2 is opposite to that of the clock signal CLK2b. To perform the above process, the clock driving circuit 420 includes a first inverter group (not shown) where n inverters are connected in series and a second inverter group (not shown) where (n+1) inverters are connected in series.

The charge pump 430 performs a pumping operation in accordance with the clock signals CLK2 and CLK2b outputted from the clock driving circuit 420, thereby outputting a pumping voltage VPP.

The regulator 440 stabilizes the pumping voltage VPP to a voltage having constant level.

The regulator 440 includes a voltage dividing circuit 444 for outputting a divided voltage VDIV generated by dividing the pumping voltage VPP, a comparing circuit 442 for comparing the divided voltage VDIV with a reference voltage VREF and controlling operation of the clock driving circuit 420 in accordance with the comparing result, a regulator driving circuit 446 for controlling operation of the regulator 440, and a high voltage discharging circuit 448 for discharging a voltage applied to one terminal of the comparing circuit 442 when supply of a power supply voltage is cut off.

The voltage dividing circuit 444 has a plurality of resistors R0 and R1 coupled in series between a terminal related to the pumping voltage VPP and a ground, and outputs the divided voltage VDIV to the comparing circuit 442 in accordance with a resistance ratio of the resistors R0 and R1. Here, the resistance ratio may be changed by a user. In this case, the divided voltage VDIV is varied depending on the resistance ratio, and thus the high voltage discharging circuit 448 may be changed. This will be described in detail with reference to accompanying drawing.

The regulator driving circuit 446 includes an N-MOS transistor N446 coupled between the resistor R1 and the ground. In addition, the regulator driving circuit 446 couples the voltage dividing circuit 444 to the ground in response to a control signal REG_ON (having a high level) to a gate of the N-MOS transistor N446, thereby enabling the regulator 440. However, in the case that supply of the power supply voltage is stopped, the control signal having a low level is applied to the N-MOS transistor N446. Hence, the regulator driving circuit 446 is disconnected from the ground.

The comparing circuit 442 compares the reference voltage VREF with the divided voltage VDIV, and outputs a signal EN having high level to the clock driving circuit 420 when the reference voltage VREF is higher than the divided voltage VDIV.

Since the comparing circuit 442 is the same as in the comparing circuit 142 of FIG. 2, any further description concerning the comparing circuit 442 will be omitted.

The high voltage discharging circuit 448 has a diode-connected transistor N448 coupled between one terminal of the comparing circuit 442 (or a node between the resistor R0 and the resistor R1) and a terminal connected to the power supply voltage. The diode-connected transistor N448 has is an N-MOS transistor with its drain terminal coupled to its gate terminal, so that it functions like a diode. Alternatively, a diode may be used instead of the diode-connected transistor N448.

The high voltage discharging circuit 448 is configured not to operate when the power supply voltage is normally provided. The discharging circuit 448, however, is configured to discharge a high voltage applied to the one terminal of the comparing circuit 442 when the power supply voltage is cut off.

Hereinafter, operation of the high voltage discharging circuit 448 will be described in detail with reference to the accompanying drawings.

Figure 5A:
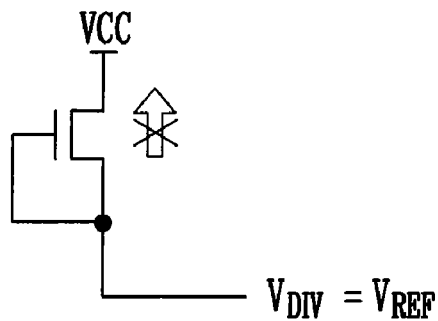
FIG. 5A is a view illustrating operation of the high voltage discharging circuit when the power supply voltage is provided.
Figure 5B:
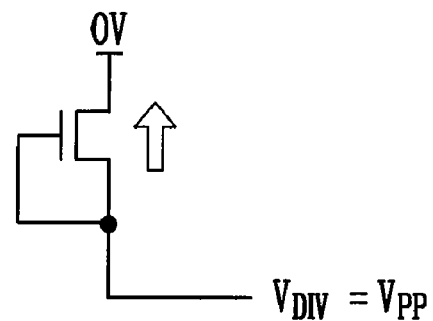
FIG. 5B is a view illustrating operation of the high voltage discharging circuit when supply of the power supply voltage is stopped.

FIG. 5A is a view illustrating operation of the high voltage discharging circuit when the power supply voltage is provided. FIG. 5B is a view illustrating operation of the high voltage discharging circuit when supply of the power supply voltage is stopped.

The voltage applied to the one terminal of the comparing circuit 442 is smaller than sum of the power supply voltage Vcc and a threshold voltage Vth of the diode-connected transistor N448 when the power supply voltage Vcc is provided, and so the diode-connected transistor N448 is not turned on. Accordingly, no voltage is discharged through the high voltage discharging circuit 448, i.e., a significant amount of voltage is not discharged.

The voltage applied to the one terminal of the comparing circuit 442 becomes higher than sum of the power supply voltage Vcc and the threshold voltage Vth of the diode-connected transistor N448 when the power supply voltage Vcc is cut off, and so the diode-connected transistor N448 is turned on. Here, the power supply voltage Vcc has a ground voltage. Accordingly, the voltage is discharged through the high voltage discharging circuit 448 and not applied to the one terminal of the comparing circuit 442. Here, magnitude of the voltage applied to the one terminal of the comparing circuit 442 is varied in accordance with the voltage dividing circuit 444. This will be described in detail.

For example, if the ratio of the first resistor R0 and the second resistor R1 equals to 19:1 and the voltage outputted from the lo charge pump 430 is 20V, the divided voltage VDIV is 1V because the voltage is proportional to R1/(R0+R1). Here, the divided voltage VDIV of 1V is a voltage when the power supply voltage Vcc is normally applied. However, when the supply of the power supply voltage Vcc is cut off, the voltage dividing circuit 444 is disconnected from the ground as mentioned above. As a result, the voltage of 20V is applied to the comparing circuit 442.

In short, the magnitude of the divided voltage VDIV may be varied in accordance with the selection of the resistors of the voltage dividing circuit 444. Accordingly, the threshold voltage of the diode-connected transistor N448 should be changed depending on the variation of the voltage dividing circuit 444. In other words, sum of the power supply voltage Vcc and the threshold voltage of the diode-connected transistor N448 is set to have a value higher than the divided voltage VDIV so that the diode N448 is not turned on at a time point at which the power supply voltage Vcc is provided.

In addition, the divided voltage VDIV is set to have a value higher than the sum of the threshold voltage of the diode-connected transistor N448 and the power supply voltage Vcc so that the diode-connected transistor N448 is turned on when the power supply voltage Vcc is cut off. In another embodiment of the present invention, the threshold voltage may be adjusted by connecting several diodes in series.

Figure 6:
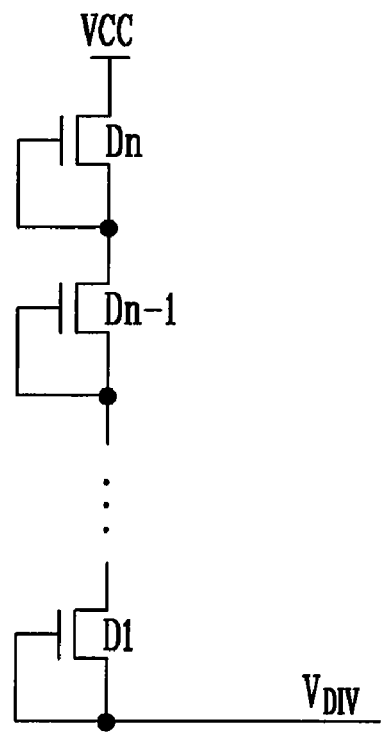
FIG. 6 is a view illustrating circuitry of a high voltage discharging circuit according to another example embodiment of the present invention.

FIG. 6 is a view illustrating circuitry of a high voltage lo discharging circuit according to another embodiment of the present invention.

The high voltage discharging circuit 448 includes a plurality of diodes or diode-connected transistors D1 to Dn that are coupled in series. The threshold voltage is increased by number of the diode-connected transistors D1 to Dn. That is, the sum of total threshold voltages equals to Vth1+Vth2+ . . . +Vthn−1+Vthn. Accordingly, in the case that the divided voltage VDIV is increased at the time point at which the power supply voltage Vcc is provided, the threshold voltage may be increased by augmenting the number of the diodes.

Figure 7:
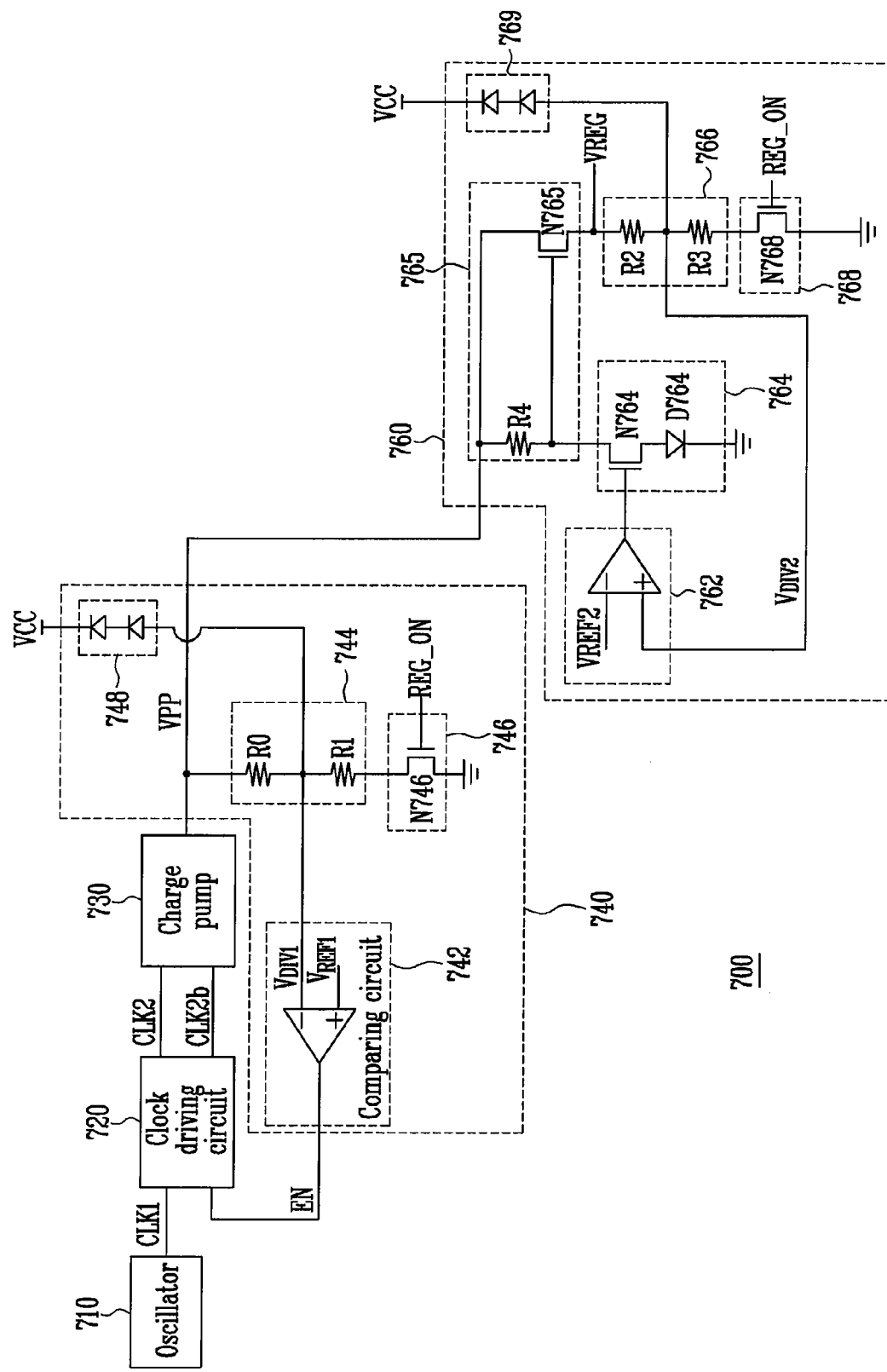
FIG. 7 is a view illustrating a circuitry of a high voltage generator according to still anther example embodiment of the present invention.

FIG. 7 is a view illustrating a circuitry of a high voltage generator according to another embodiment of the present invention.

The high voltage generator 700 includes an oscillator 710, a clock driving circuit 720, a charge pump 730, a first regulator 740 and a second regulator 760.

The oscillator 710 generates a clock signal CLK1 having specific period, and transmits the generated clock signal CLK1 to the clock driving circuit 720.

The clock driving circuit 720 delays the clock signal CLK1 in accordance with an enable signal EN outputted from a first comparing circuit 742 of the first regulator 740, thereby outputting two clock signals CLK2 and CLK2b, wherein a level of the clock signal CLK2 is opposite to that of the clock signal CLK2b. To perform the above process, the clock driving circuit 720 includes a first inverter group (not shown) where n inverters are connected in series and a second inverter group (not shown) where (n+1) inverters are connected in series.

The charge pump 730 performs a pumping operation in accordance with the clock signals CLK2 and CLK2b outputted from the clock driving circuit 720, thereby outputting a pumping voltage VPR The first regulator 740 stabilizes the pumping voltage VPP to a desired voltage level.

The first regulator 740 includes a first voltage dividing circuit 744 for outputting a first divided voltage VDIV1 generated by dividing the pumping voltage VPP, a first comparing circuit 742 for comparing the first divided voltage VDIV1 with a first reference voltage VREF1 and controlling operation of the clock driving circuit 720 in accordance with the comparing result, a first regulator driving circuit 746 for controlling operation of the first regulator 740, and a first high voltage discharging circuit 748 for discharging a voltage applied to one terminal of the first comparing circuit 742 when supply of a power supply voltage is stopped.

The first voltage dividing circuit 744 has a plurality of resistors R0 and R1 coupled in series between a terminal related to the pumping voltage VPP and a ground, and outputs the first divided voltage VDIV1 to the first comparing circuit 742 in accordance with the resistance ratio of the resistors R0 and R1.

The first comparing circuit 742 compares the first reference voltage VREF1 with the first divided voltage VDIV1, and outputs the signal EN having a high level to the clock driving circuit 720 when the first reference voltage VREF1 is higher than the first divided voltage VDIV1. Here, the first reference voltage VREF1 has the same magnitude as the first divided voltage VDIV1, and thus a first divided voltage inputted to the first comparing circuit 742 is compared with the first reference voltage VREF1.

Since constitution of the first comparing circuit 742 is substantially the same as in the comparing circuit 142 in FIG. 2, any further description about the first comparing circuit 742 will be omitted.

A final pumping voltage VPP (i.e., output voltage of the charge pump 730) can be calculated using Equation 2 below.

$$VPP = \left(1 + \frac{R0}{R1}\right) \times VREF1 \quad \text{[Equation 2]}$$

The first high voltage discharging circuit 748 has a diode coupled between one terminal of the first voltage dividing circuit 744 to which the first divided voltage VDIV1 is inputted and a terminal corresponding to the power supply voltage Vcc. Here, the diode may be embodied with an N-MOS transistor. FIG. 7 shows two diodes coupled in series, but the first high voltage discharging circuit 748 may be made up of one diode or more than three diodes coupled in series.

The first high voltage discharging circuit 748 does not operate when the power supply voltage Vcc is normally applied, and discharges the high voltage applied to the one terminal of the first comparing circuit 742 only when the power supply voltage Vcc is not provided.

Since operation of the first high voltage discharging circuit 748 is substantially identical to that in FIG. 5A and FIG. 5B, any further description about the high voltage discharging circuit 748 will be omitted.

The first regulator 740 outputs a first regulation voltage by controlling only the operation of the charge pump 730, where a ripple can occur to the outputted first regulation voltage. To remove the ripple, the high voltage generator 700 of the present embodiment further includes the second regulator 760 using a method of controlling current.

The second regulator 760 converts the first regulation voltage into a voltage having a constant level, thereby outputting a second regulation voltage.

The second regulator 760 includes a current cut circuit 764 for forming a current path between an output terminal of the first regulator 740 and a ground, a second voltage dividing circuit 766 for outputting a second divided voltage by dividing a voltage of an output terminal of the second regulator 760, a second comparing circuit 762 lo for controlling operation of the current cut circuit 764 by comparing the second divided voltage with a second reference voltage, a voltage supplying circuit 765 for supplying or cutting off the first regulation voltage to the output terminal of the second regulator 760 in accordance with forming of the current path, a second regulator driving circuit 768 for controlling operation of the second regulator 760, and a second high voltage discharging circuit 779 for discharging a voltage to be applied to the second comparing circuit 762 when supply of the power supply voltage Vcc is stopped.

The second voltage dividing circuit 766 has a third resistor R2 and a fourth resistor R3 coupled in series between an output terminal VREG and the ground, and outputs the second divided voltage VDIV2 by dividing the second regulation voltage in accordance with the resistance ratio of the resistors R2 and R3.

The second comparing circuit 762 controls the operation of the current cut circuit 764 by comparing the second divided voltage with the second reference voltage VREF2. Here, since the second reference voltage VREF2 has the same magnitude as the second divided voltage VDIV2, the second divided voltage inputted is compared with the second reference voltage VREF2. The second comparing circuit 762 outputs a voltage having a high level when the second divided voltage is higher than the second reference voltage VREF2, and outputs the voltage having low level when the second divided voltage is smaller than the second reference voltage VREF2.

The current cut circuit 764 has an N-MOS transistor N764 turned on in response to the voltage outputted from the second comparing circuit 762, and forms the current path between the output terminal of the first regulator 740 and the ground through the N-MOS transistor N764.

The N-MOS transistor N764 is coupled between the voltage supplying circuit 765 and the ground, and is turned on in response to the voltage having a high level outputted from the second comparing circuit 762, thereby forming the current path between the output terminal of the charge pump 730 and the ground. In one example embodiment of the present invention, the current cut circuit 764 may further have a diode D764 for preventing a reverse flow of the current between the N-MOS transistor N764 and the ground. Accordingly, since the second comparing circuit 762 outputs the voltage having high level in case that the second divided voltage is higher than the second reference voltage VREF2, the current path is formed through the current cut circuit 764. Here, the magnitude of current passing through the current path is increased as the second divided voltage is higher than the second reference voltage VREF2. In addition, the first regulation voltage VPP is reduced accordingly as the current path is formed.

On the other hand, since the second comparing circuit 762 outputs the voltage having a low level when the second divided voltage is smaller than the second reference voltage VREF2, the N-MOS transistor N764 is turned off. As a result, the current path is cut off.

The voltage supplying circuit 765 provides the first regulation voltage VPP to the output terminal VREG of the second regulator 760 or cuts off the first regulation voltage VPP in accordance with forming the current path.

The voltage supplying circuit 765 has a resistor R4 coupled between the output terminal of the charge pump 730 and the current cut circuit 764, and an N-MOS transistor N765 coupled between the output terminal of the charge pump 730 and the output terminal VREG of the second regulator 760, wherein a voltage of a couple point of the resistor R4 and the current cut circuit 764 is applied to the N-MOS transistor N765.

The first regulation voltage VPP is directly applied to a gate terminal of the N-MOS transistor N765 when the current path is not formed, and so the N-MOS transistor N765 is turned on. As a result, the first regulation voltage VPP is provided to the output terminal VREG of the second regulator 760.

However, a voltage applied to the gate terminal of the N-MOS transistor N765 has a low level when the current path is formed, and so the N-MOS transistor N765 is not turned on. As a result, the first regulation voltage VPP is not provided to the output terminal VREG of the second regulator 760.

A voltage of the output terminal VREG can be calculated from Equation 3 below.

$$VREG = \left(1 + \frac{R2}{R3}\right) \times VREF2 \quad \text{[Equation 3]}$$

The second high voltage discharging circuit 769 has a diode coupled between the one terminal of the second comparing circuit 762 and a terminal corresponding to the power supply voltage Vcc. Here, the diode may be embodied with an N-MOS transistor. FIG. 7 shows two diodes coupled in series, but the second high voltage discharging circuit 769 may have only one diode or above three diodes coupled in series.

The second high voltage discharging circuit 769 does not operate in case that the power supply voltage Vcc is normally provided, and discharges the voltage to be applied to the one terminal of the second comparing circuit 762 in case that the power supply voltage Vcc is not provided.

Since operation of the second high voltage discharging circuit 769 is substantially identical to that in FIG. 5A and FIG. 5B, any further description concerning the second high voltage discharging circuit 769 will be omitted.

Figure 8:
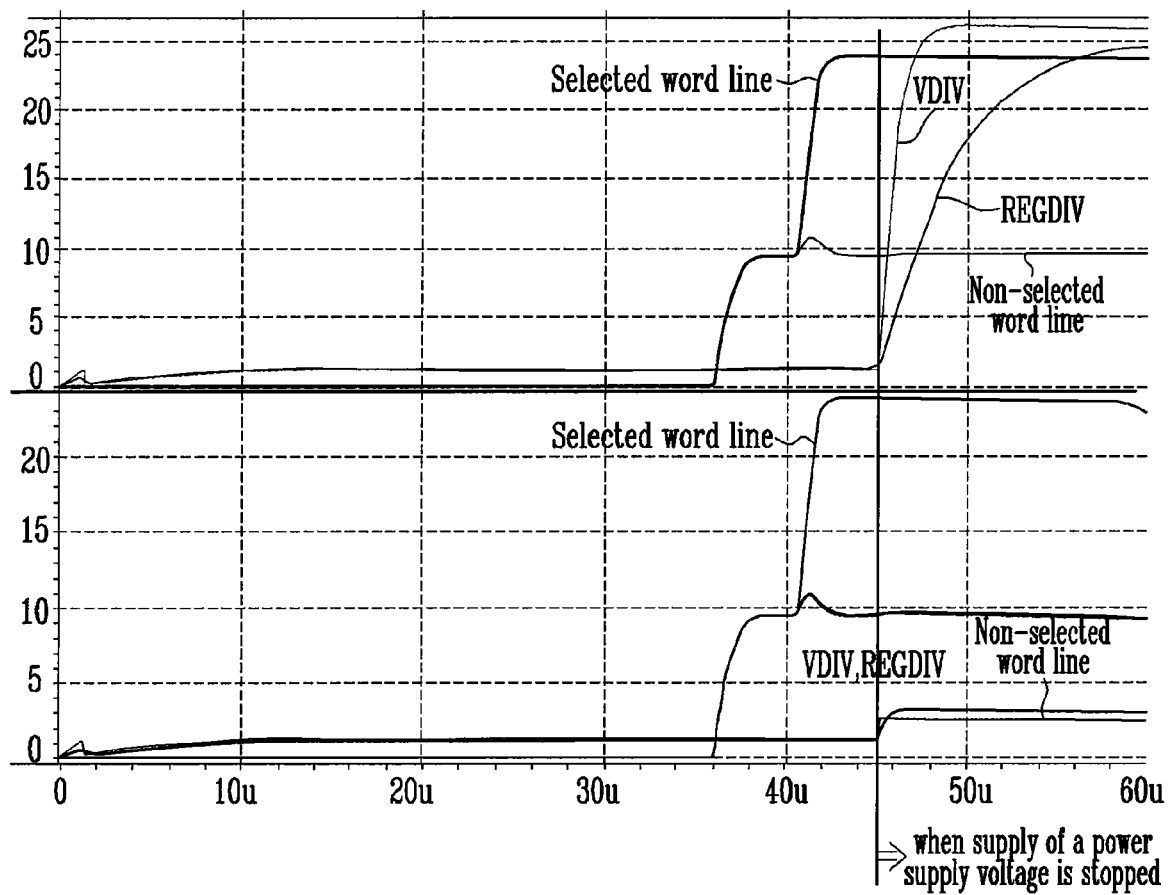
FIG. 8 is a view illustrating operation of the high voltage generator in accordance with supply of the power supply voltage.

FIG. 8 is a view illustrating operation of the high voltage generator in accordance with supply of the power supply voltage.

FIG. 8 shows a voltage supplied by the high voltage generator when a program operation is performed in a non-volatile memory device.

In the conventional high voltage generator, a voltage having high level is provided to a selected word line and a voltage having low level is provided to non-selected word line when the power supply voltage is provided. However, the voltage outputted from the charge pump is applied to the one terminal of the comparing circuit when supply of the power supply voltage is stopped. Here, the voltage is far higher than a breakdown voltage of a transistor included in the comparing circuit.

In the high voltage generator of the present invention, a voltage having a high level is provided to a selected word line and a voltage having a low level is provided to non-selected word lines when the power supply voltage is provided like the conventional high voltage generator. However, a high voltage to be applied to the comparing circuit is discharged through the high voltage discharging circuit when supply of the power supply voltage is stopped. As a result, a voltage applied to the one terminal of the comparing circuit is far smaller compared to in the conventional high voltage generator.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A regulator comprising:
   a voltage dividing circuit configured to divide an output voltage of a charge pump;
   a comparing circuit configured to compare a divided voltage outputted through a node of the voltage dividing circuit with a reference voltage and generate a clock enable signal to control the charge pump; and
   a high voltage discharging circuit coupled between the divided voltage and a power supply voltage, wherein the high voltage discharging circuit is turned on when a power supply voltage is cut off and the high voltage discharging circuit is turned off while the power supply voltage is supplied.

2. The regulator of claim 1, wherein the regulator driving circuit has an N-MOS transistor coupled between the voltage dividing circuit and the ground.

3. The regulator of claim 1, wherein the high voltage discharging circuit includes a diode component having an end coupled to a node within the voltage dividing circuit.

4. The regulator of claim 1, wherein the control signal is not applied to the regulator driving circuit if the power supply voltage is cut off, wherein the regulator driving circuit disconnects the voltage dividing circuit from the ground.

5. The regulator of claim 1, wherein the high voltage discharging circuit has a diode component having a first terminal coupled to an input terminal of the comparing circuit and a second terminal coupled to the power supply voltage.

6. The regulator of claim 5, wherein the diode component is a diode-connected transistor having a third terminal provided between the first and second terminals, the first terminal and third terminal being connected to each other.

7. The regulator of claim 5, wherein the divided voltage applied to the input terminal of the comparing circuit is higher than the sum of the power supply voltage and a threshold voltage of the diode component when the power supply voltage is being provided.

8. The regulator of claim 1, wherein the high voltage discharging circuit includes a plurality of diode components connected in series.

9. The regulator of claim 8, wherein the diodes are diode-connected transistors.

10. The regulator of claim 8, wherein the divided voltage received at an input terminal of the comparing circuit when the power supply voltage is being provided is higher than the sum of threshold voltages of the diode components.

11. The regulator of claim 1, wherein the high voltage discharging circuit couples an input terminal of the comparing circuit to the ground when supply of the power supply voltage is stopped.

12. A high voltage generator comprising:
a regulator configured to stabilize an output voltage of a charge pump to a voltage having a substantially constant level,
wherein the regulator includes:
a voltage dividing circuit configured to divide the output voltage of the charge pump and output a divided voltage;
a comparing circuit configured to compare a divided voltage outputted through a node of the voltage dividing circuit with a reference voltage and generate a clock enable signal to control the charge pump; and
a high voltage discharging circuit coupled between the divided voltage and a power supply voltage, wherein the high voltage discharging circuit is turned on when a power supply voltage is cut off and the high voltage discharging circuit is turned off while the power supply voltage is supplied.

13. The high voltage generator of claim 12, wherein the high voltage discharging circuit has a diode-connected transistor having a first terminal coupled to the input terminal of the comparing circuit and a second terminal coupled to a power supply voltage line.

14. The high voltage generator of claim 13, wherein the divided voltage applied to the input terminal of the comparing circuit is higher than the sum of the power supply voltage and a threshold voltage of the diode-connected transistor when the power supply voltage is being provided.

15. The high voltage generator of claim 12, wherein the high voltage discharging circuit includes a plurality of diode components coupled in series between the input terminal of the comparing circuit and the power supply voltage line.

16. The high voltage generator of claim 15, wherein the diode components are diode-connected transistor, wherein the divided voltage applied to the input terminal of the comparing circuit when the power supply voltage is being provided is higher than the sum of threshold voltages of the diode-connected transistors.

17. The high voltage generator of claim 12, wherein the high voltage discharging circuit couples the input terminal of the comparing circuit to the ground when the power supply voltage is cut off.

18. A high voltage generator comprising:
a first regulator configured to stabilize an output voltage of a charge pump to a first regulation voltage having a substantially constant level and output the first regulation voltage; and a second regulator configured to convert the first regulation voltage into a voltage having a substantially constant level and output the substantially constant voltage,
wherein the first regulation includes:
a first voltage dividing circuit configured to divide the output voltage of the charge pump, thereby outputting a first divided voltage;
a first comparing circuit configured to compare a reference voltage with the first divided voltage, and output a first control signal for controlling operation of a clock driving circuit;
a first regulator driving circuit configured to couple the first voltage dividing circuit to a ground according to a second control signal; and
a first high voltage discharging circuit configured to discharge the first divided voltage applied to the first comparing circuit when a power supply voltage is cut off,
wherein the second control signal is in a low level or 0V when the power supply voltage is cut off.

19. The high voltage generator of claim 18, wherein the second regulator includes:
a current cut circuit configured to form a current path between an output terminal of the first regulator and the ground;
a second voltage dividing circuit configured to output a second divided voltage generated by dividing a voltage of an output terminal of the second regulator;
a second comparing circuit configured to compare the second dividing voltage with a second reference voltage, and control an operation of the current cut circuit in accordance with the compared result;
a voltage supplying circuit configured to supply the first regulation voltage to the output terminal of the second regulator or cut off the first regulation voltage in accordance with forming of the current path;
a second regulator driving circuit configured to couple the second voltage dividing circuit to the ground according to a third control signal; and
a second high voltage discharging circuit configured to discharge the second divided voltage applied to the second comparing circuit when the power supply voltage is cut off,
wherein the third control signal is in a low level or 0V when the power supply voltage is cut off.

20. The high voltage generator of claim 18, wherein the first high voltage discharging circuit has a diode component having a first terminal coupled to an input terminal of the first comparing circuit.

21. The high voltage generator of claim 18, wherein the second high voltage discharging circuit has a diode component having a first terminal coupled to an input terminal of the second comparing circuit.

22. The high voltage generator of claim 18, wherein the first high voltage discharging circuit couples an input terminal of the first comparing circuit to the ground when the power supply voltage is cut off, and
wherein the first divided voltage is applied to the input terminal of the first comparing circuit.

23. The high voltage generator of claim 18, wherein the second high voltage discharging circuit couples an input terminal of the second comparing circuit to the ground when the power supply voltage is cut off, and
wherein the second divided voltage is applied to the input terminal of the second comparing circuit.

* * * * *